United States Patent [19]

Najm et al.

[11] Patent Number: 5,345,534
[45] Date of Patent: Sep. 6, 1994

[54] SEMICONDUCTOR WAFER HEATER WITH INFRARED LAMP MODULE WITH LIGHT BLOCKING MEANS

[75] Inventors: Habib N. Najm, Dallas; Steve S. Huang, Richardson; Cecil J. Davis, Greenville; Robert T. Matthews, Plano, all of Tex.

[73] Assignee: Texas Instruments Incorporated, Dallas, Tex.

[21] Appl. No.: 39,720

[22] Filed: Mar. 29, 1993

[51] Int. Cl.$^5$ ............................................. H01L 21/20
[52] U.S. Cl. .................................. 392/422; 392/316; 118/724
[58] Field of Search ............... 392/422, 416, 418, 411; 219/390, 405, 411; 118/724, 725, 728, 729, 730, 50.1

[56] References Cited

U.S. PATENT DOCUMENTS

| 4,508,960 | 4/1985 | Arai | 219/405 |
| 5,233,163 | 8/1993 | Mieno et al. | 219/390 |

FOREIGN PATENT DOCUMENTS

| 63-227014 | 9/1988 | Japan . |
| 1-146280 | 6/1989 | Japan . |
| 2-133394 | 5/1990 | Japan . |
| 4-288820 | 10/1992 | Japan . |

Primary Examiner—Bruce A. Reynolds
Assistant Examiner—John A. Jeffery
Attorney, Agent, or Firm—Mark A. Valetti; Wade J. Brady; Richard L. Donaldson

[57] ABSTRACT

A thin reflective cylindrical baffle [20] in a radiant lamp heater is provided in the space below a plurality of heating bulbs [2,4,6] (arranged in a center position and around a middle and outer ring) and above a quartz window [12]. The baffle diameter is such that it fits within the annular space between the middle [4] and outer [6]ring of bulbs. The baffle which blocks a predetermined amount of light generated by the lamp bulbs [20] allows improved controllability of wafer temperature profile—for a wafer heated by a radiant lamp heater.

10 Claims, 3 Drawing Sheets

SEMICONDUCTOR WAFER HEATER WITH INFRARED LAMP MODULE WITH LIGHT BLOCKING MEANS

BACKGROUND OF THE INVENTION

The use of direct radiant lamp heating of silicon wafers in Rapid Thermal Processing (RTP) equipment is gaining widespread acceptance. Experimental observations suggest that the lamp heater is a critical factor in achieving an acceptable temperature ramp time, and controllable process uniformity on the wafer. 38 kW lamp modules have been shown to provide good temperature ramping performance resulting in fast throughput and short process time. However, the present uniformity performance of this equipment for high pressure processing (e.g. 650 torr) is unacceptable since typically, the center of the wafer undergoing processing is heated to higher temperatures than the edges of the wafer. This problem shall be explained in more detail with reference to FIGS. 1a and 1b which represent a top view and a side cross-sectional view, respectively, of a prior art lamp heater for optical zone heating of a semiconductor wafer. A source of light comprising 37 lamps are arranged in an axisymmetric 3-zone configuration including a central 2 kW light bulb 2, a middle ring of 12 1 kW light bulbs 4, and an outer ring of 24 1 kW light bulbs 6. Bulb 2 shall be referred to as the central zone lamp. Middle ring of bulbs 4 shall be referred to as the middle zone of lamps and outer ring 6 shall be referred to the outer zone of lamps. The bulbs fit into lamp assembly 3. The radiant power emitted from the bulbs is concentrated by gold plating 8 into process chamber 9 onto silicon wafer 10 (for instance, a 6 inch diameter wafer), through quartz window 12. Quartz window 12 can, for instance, be 10 inches in diameter and ½ inch thick. Radiant power will be directed at wafer 10. Heating uniformity is attempted through the manipulation of electrical power supplied to each zone of lamps. Thus selective heating of the outer rim, 11, of wafer 10 is intended relative to central portion 13 of wafer 10 by generating more radiant power from the outer zone of lamps than from the other zone of lamps. However, this lamp heater allows significant optical overlap between the three zones of lamps in terms of incident radiant power on wafer 10. This overlap is the source of the problem with the temperature profile and process uniformity control since central portion 13 of wafer 10 is heated more by the heater relative to the rest of wafer 10, particularly around edge 11. Even in an attempt to prevent this non uniform heating, with the outer zone turned on, and the remaining zones are turned off, significantly more heating of central portion 13 of wafer 10 will still occur relative to edge 11. Differential heating around edge 11 is relatively minor when compared with this problem concerning the heating of central portion 13 of wafer 10. Given the added effects of edge 11 cooling and gas flow dynamics at high pressure in process chamber 9, this problem of central portion 13 heating is very undesirable. It is critical that wafer edge 13 be heated selectively to overcome these effects and allow uniform process results.

Other lamp heaters, such as the G-Squared TM lamp, solve the problem by imbedding the bulbs in a water cooled metallic casing where there is no overlap at all between light radiated from individual lights bulbs onto a wafer. This type of lamp heater is in many cases prohibitively expensive, primarily because of the difficulties in manufacturing the lamp hardware.

A need therefore exists to develop a less costly means to solve the foregoing discussed problem.

SUMMARY OF THE INVENTION

The invention provides a semiconductor wafer lamp heater which includes a source of light and a baffle. The light directed toward a portion of a plane from a predetermined portion of the source of light is blocked by the baffle while light from the remaining portion of the source is not blocked from this portion of the plane by the baffle. The invention allows uniform heating of a wafer lying substantially in the plane.

DETAILED DESCRIPTION OF THE INVENTION

The invention solves the foregoing discussed problem by providing a thin reflective cylindrical baffle in the space between the lamps and the quartz window. The diameter of the baffle is such that it places the baffle in the annular space between the middle ring and outer ring of bulbs. The baffle will prevent much of the light emitted by the outer ring of bulbs from arriving in the central portion of the wafer and will direct most of the light towards the wafer edge.

Figure 1A:
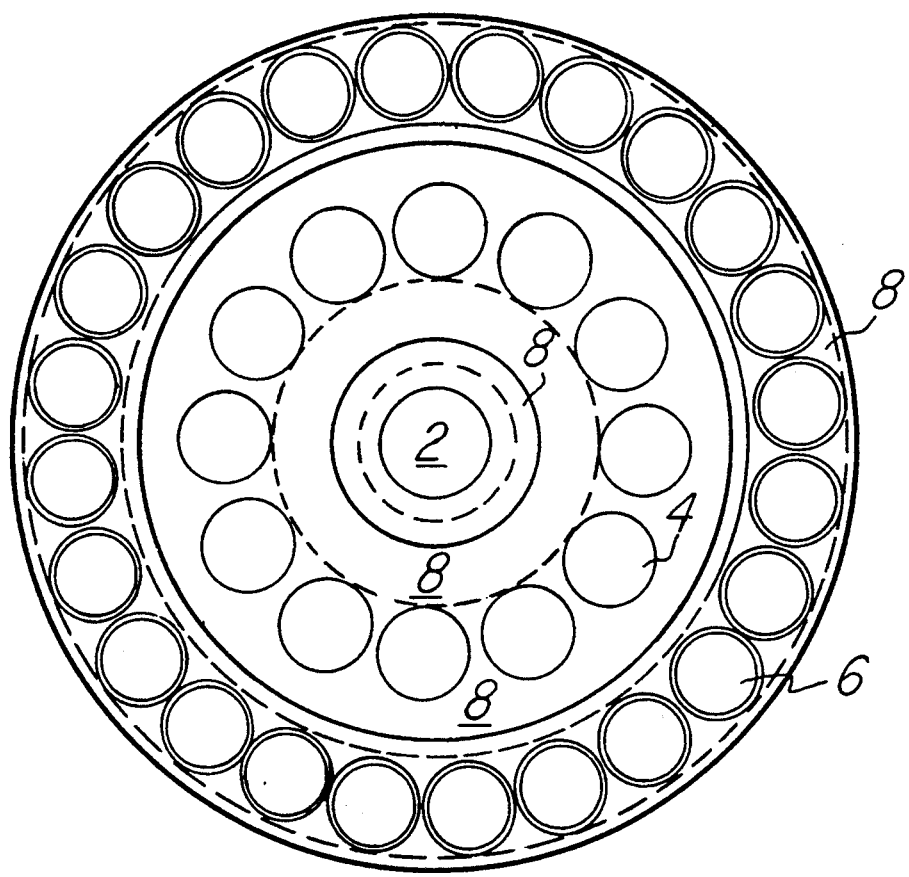
FIG. 1a and 1b represent a top view and a side cross-sectional view, respectively, of a prior art lamp heater for optical zone heating of a semiconductor wafer.
Figure 1B:
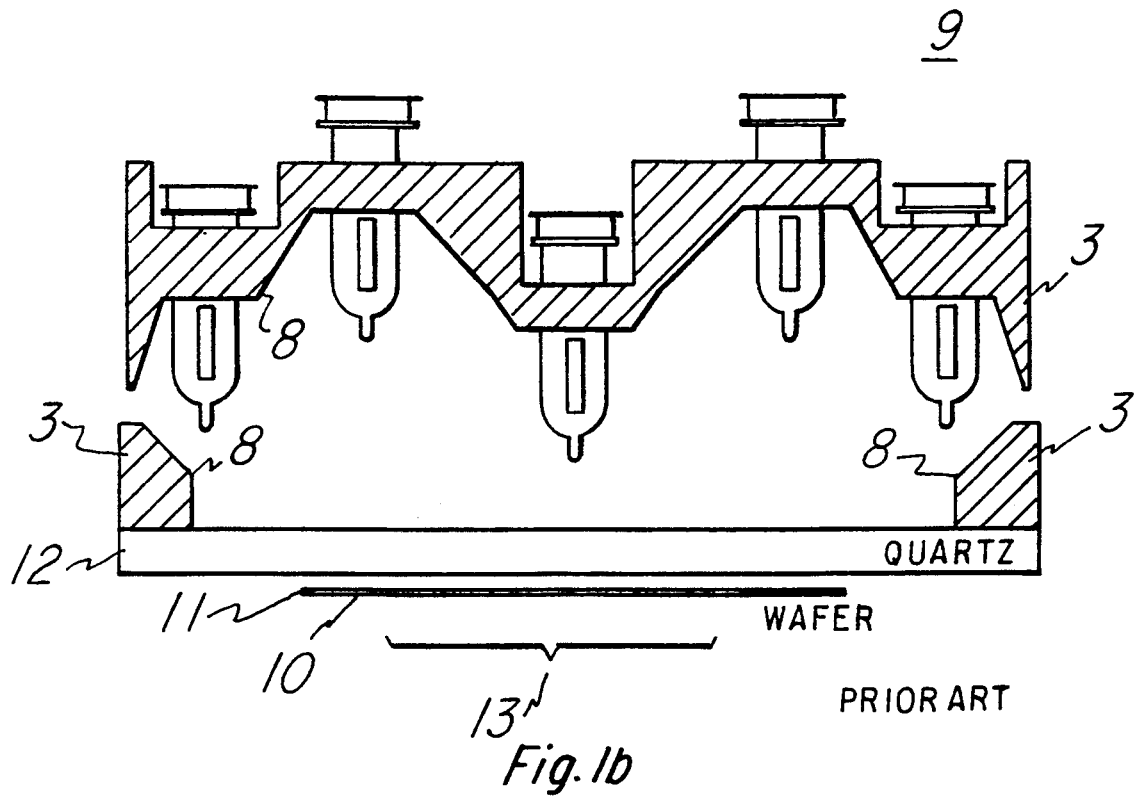
Figure 2:
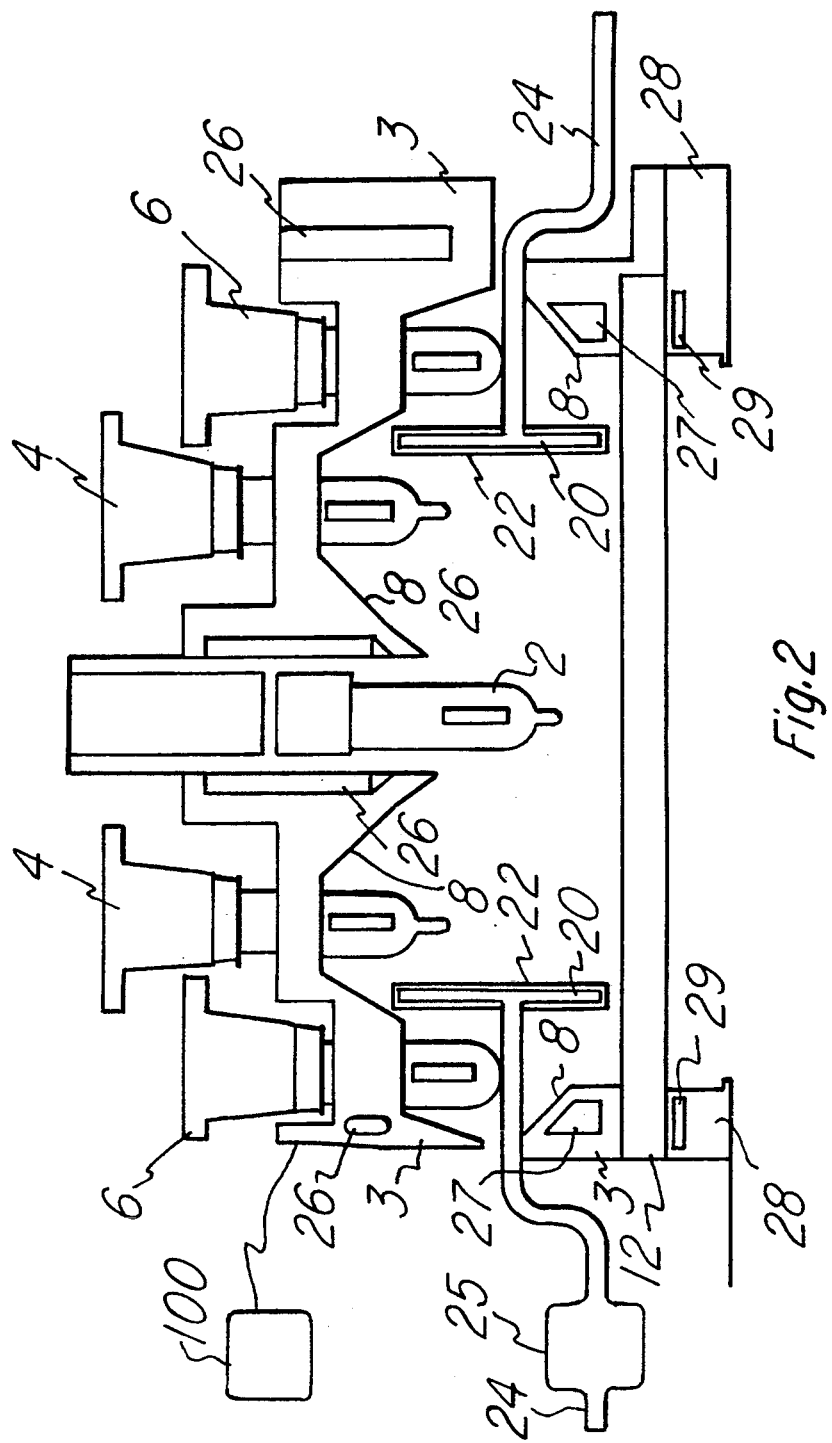
FIG. 2 illustrates a cross-sectional view of the invention's lamp heater with its cylindrical reflective baffle.

FIG. 2 illustrates a cross-sectional view of the invention's lamp heater with its cylindrical baffle 20. Optionally, baffle 20 can be gas or preferably liquid cooled by a coolant (e.g. water). As such, annular passageway 22 is provided inside baffle 20 so that the coolant can flow therein. Pipes 24 provide inlet and outlet paths for coolant from coolant source 25 travelling through annular passageways 22 in baffle 20. Assembly 3 is also cooled by a coolant sourced from coolant source 100 which flows through a coolant passageway 26. There are several of such passageways and the coolant can comprise water, gas, or freon. Support 28 houses o-rings 29 which make contact with quartz window 12 and hold quartz window 12 in place by means of vacuum pressure. Note that a coolant passageway 27 passes directly over support 28. Coolant flowing through passageway 27 in assembly 3 together with gold plating 8 on assembly 3 help cool and deflect heat away from o-rings 29 in support 28.

Figure 3A:
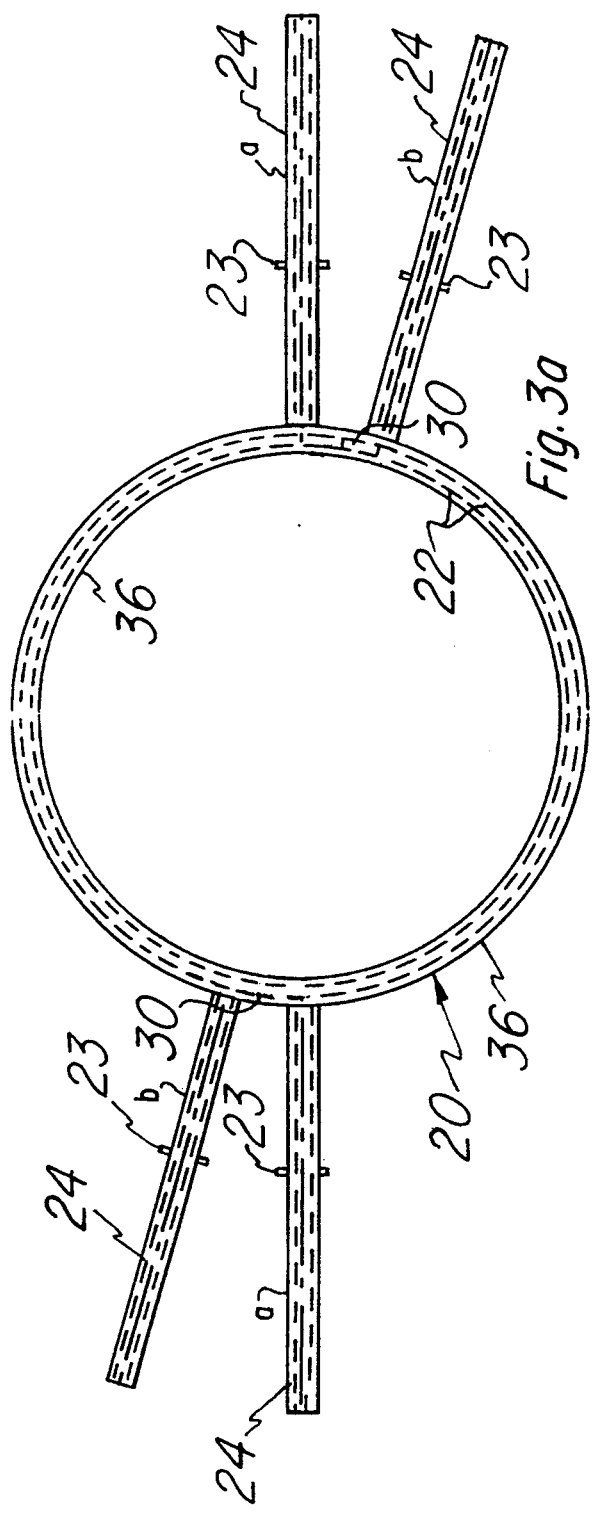
FIGS. 3a and 3b illustrate top and side views, respectively, of the baffle shown in FIG. 2.
Figure 3B:
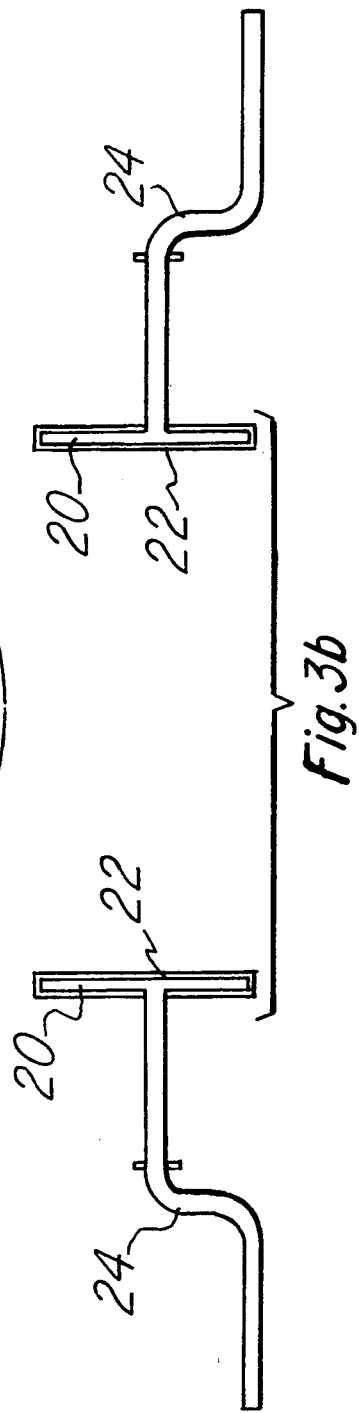

FIGS. 3a and 3b illustrate top and side views, respectively, of baffle 20 shown in FIG. 2. Support washer 23 supports pipe 24 on assembly 3. With reference to FIGS. 3a and 3b, the dimensions of baffle 20 and pipes 24 are indicated as shown. For instance, support washer 23 has an outer diameter of 0.5" which is 0.063 inches thick and each pipe 24 has an outer diameter of 0.25". Further, the baffle height shown is 2.500" with a baffle inner diameter of 6.000". Coolant is forced in through pipe 24 labeled "a" into each passageway 22 and coolant is forced out of each passageway through pipe 24 labeled "b." Barriers 30 within passageway 22 help direct the coolant flow along a specified path in passageway 22.

The invention's baffle must be able to withstand the intense heat it is subjected to. Consequently, materials from which the baffle can be constructed include quartz, stainless steel, and molybdenm. Optimally, baffle 20 includes a reflective coating 36 on the inner and outer cylindrical surfaces of baffle 20 as shown. Such a coating can, for instance, be gold or chrome coating.

Several of the invention's heaters were implemented, as part of an experiment, in an actual reactor. The baffle material was 1/16" thick stainless steel with gold coating. Three baffles were built with heights of 1, 2 and 3 inches, each having a baffle diameter of 6 inches. Tests (using set-ups dimensionally similar to those shown in FIGS. 3a and 3b) with these baffles on two reactors showed significant wafer processing improvement with the 2 and 3 inch cases, and not much effect with the 1 inch case. In particular, the 3 inch case exhibited the best selective heating capability. With only the outer ring of bulbs on, and using the 3 inch tall baffle, a temperature difference between wafer edge and center was measured in the range of 30° to 100 ° C. This is significantly better than the performance of the heater without the baffle. Further, with the other two zones turned on, excellent temperature uniformity (plus or minus 0.5° C.) was easily achieved over a 6 inch wafer, under typically difficult conditions associated with high pressure (650 tort) processing. Part of a control experiment, a non-baffled lamp performance at this pressure was plus or minus 15° C. at best, attributed to the significant edge cooling by gas flow within the process chamber and poor selective edge heating capability. These tests also showed the inadequacy of the gold coating on an uncooled baffle under severe heating conditions. The coating was observed to degrade and disappear upon use, causing the baffle to absorb more radiation and overheat, resulting in baffle warpage and non-uniform wafer heating. A water-cooled baffle according to the invention solved this problem of coating degradation. The baffle material of the cooled baffle must necessarily be thicker than the baffle which does not use coolant. However, this thicker baffle will be more capable of withstanding intense heating.

Although the invention has been described in detail herein with reference to its preferred embodiment and certain described alternatives, it is to be understood that this description is by way of example only, and it is not to be construed in a limiting sense. It is to be further understood that numerous changes in the details of the embodiments of the invention, and additional embodiments of the invention, will be apparent to, and may be made by persons of ordinary skill in the art having reference to this description. It is contemplated that all such changes and additional embodiments are within the true scope and spirit of the invention as claimed below.

We claim:

1. A semiconductor wafer lamp heater comprising:
   a source of light which includes a plurality of light bulbs, said bulbs being positioned so as to lie in and define substantially concentric first and second cylinders; and
   a cylindrical baffle, said cylindrical baffle lying in and defining a third cylinder substantially concentric with said first and second cylinders, said third cylinder including a radius less than said first cylinder and greater than said second cylinder.

2. A semiconductor wafer lamp heater as recited in claim 1 wherein said plurality of bulbs are mounted in an assembly, at least a portion of said assembly being coated with a light reflective material.

3. A semiconductor wafer lamp heater as recited in claim 2 wherein said light reflective material is selected from the group consisting of gold or chrome.

4. A semiconductor wafer lamp heater as recited in claim 2 wherein said assembly includes passageways capable of carrying a medium capable of cooling said assembly.

5. A semiconductor wafer lamp heater as recited in claim 4 wherein said medium is selected from the group consisting of water, gas, or freon.

6. A semiconductor wafer lamp heater as recited in claim 1 wherein said baffle includes at least one passageway capable of carrying a medium capable of cooling said baffle.

7. A semiconductor wafer lamp heater as recited in claim 6 which further includes at least one pipe connected to said baffle, said at least one pipe being capable of allowing the transport of a cooling medium to said baffle.

8. A semiconductor wafer lamp heater as recited in claim 6 wherein said baffle is coated on selected portions thereof with a light reflective material.

9. A semiconductor wafer lamp heater as recited in claim 8 wherein said reflective material is selected from the group consisting of gold or chrome.

10. A semiconductor wafer lamp heater as recited in claim 1 wherein said baffle comprises material selected from the group consisting of quartz, stainless steel, molybdenum or a combination thereof.

* * * * *